(12) United States Patent
Liu et al.

(10) Patent No.: US 10,937,991 B2
(45) Date of Patent: Mar. 2, 2021

(54) DISPLAY PANEL AND METHOD OF PACKAGING THE SAME, DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Jia Liu, Beijing (CN); Huiche Lin, Beijing (CN); Wei Hu, Beijing (CN); Zhenmei Xie, Beijing (CN); Zhiyong Li, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 131 days.

(21) Appl. No.: 16/130,108

(22) Filed: Sep. 13, 2018

(65) Prior Publication Data
US 2019/0189959 A1    Jun. 20, 2019

(30) Foreign Application Priority Data

Dec. 15, 2017   (CN) .......................... 201711353007.1

(51) Int. Cl.
| | | |
|---|---|---|
| H01L 51/52 | (2006.01) | |
| H01L 51/56 | (2006.01) | |
| H01L 27/32 | (2006.01) | |

(52) U.S. Cl.
CPC .......... *H01L 51/5253* (2013.01); *H01L 27/32* (2013.01); *H01L 51/524* (2013.01); *H01L 51/5246* (2013.01); *H01L 51/56* (2013.01)

(58) Field of Classification Search
CPC ............... H01L 51/524; H01L 51/5237; H01L 51/5246; H01L 51/5253; H01L 27/32
See application file for complete search history.

(56) References Cited

U.S. PATENT DOCUMENTS

| | | | |
|---|---|---|---|
| 6,998,648 B2* | 2/2006 | Silvernail | H01L 51/5246 257/100 |
| 2005/0062412 A1* | 3/2005 | Taniguchi | F21K 9/232 313/512 |
| 2006/0202222 A1* | 9/2006 | Lan | H01L 51/5246 257/98 |
| 2006/0220550 A1* | 10/2006 | Harada | H01L 51/5246 313/512 |
| 2014/0225099 A1* | 8/2014 | Yamae | H01L 51/5275 257/40 |
| 2014/0246665 A1* | 9/2014 | Lang | H01L 51/56 257/40 |
| 2017/0154938 A1* | 6/2017 | Su | H01L 27/3262 |

* cited by examiner

*Primary Examiner* — Marcos D. Pizarro
*Assistant Examiner* — Antonio B Crite
(74) *Attorney, Agent, or Firm* — Dinsmore & Shohl LLP

(57) ABSTRACT

The present disclosure discloses a display panel, a method for packaging the display panel, and a display device. A display panel comprising: a cover plate comprising a main body portion and a sidewall disposed at a periphery of the main body portion and surrounding the main body portion; a sealing film disposed opposite the cover plate and sealingly engaged with the sidewall of the cover plate to define a sealed package space; and an organic light emitting unit sealed within the package space.

8 Claims, 6 Drawing Sheets

(a)

(b)

DISPLAY PANEL AND METHOD OF PACKAGING THE SAME, DISPLAY DEVICE

CROSS-REFERENCE TO RELATED APPLICATIONS

This application claims priority to Chinese Patent Application No. 201711353007.1, filed on Dec. 15, 2017, the entire disclosure of which is hereby incorporated by reference herein.

TECHNICAL FIELD

The present disclosure relates to the field of display technology, particularly to a display panel and a method of packing the same, a display device.

BACKGROUND

An organic light emitting display (OLED) is fabricated using a very thin coating of an organic material that enables self-illumination when an electric current flows through the coating. Since the OLED is self-luminous, no backlight is required, and its thickness is thinner than that of an LCD. In addition, the OLED also has excellent performances such as high contrast, low power consumption, no viewing angle limitation, and the capability of realizing a flexible display.

SUMMARY

In one aspect of the disclosure, the present disclosure provides a display panel. The display panel includes a cover plate comprising a main body portion and a sidewall disposed at a periphery of the main body portion and surrounding the main body portion; a sealing film disposed opposite the cover plate and sealingly engaged with the sidewall of the cover plate to define a sealed package space; and an organic light emitting unit sealed within the package space.

In some embodiments of the present disclosure, at least a portion of the sidewall is a curved structure.

In some embodiments of the present disclosure, the main body portion is a planar structure, or at least a portion of the main body portion is a curved structure.

In some embodiments of the present disclosure, the sealing film comprises: an organic layer disposed adjacent to the organic light emitting unit; and an inorganic layer disposed on a side of the organic layer away from the organic light emitting unit.

In some embodiments of the present disclosure, the sealing film comprises: a plurality of the organic layers and a plurality of the inorganic layers that are alternately stacked on each other.

In some embodiments of the present disclosure, a connection terminal is provided on a side of the sealing film away from the package space, and the connection terminal is electrically connected to the organic light emitting unit.

In some embodiments of the present disclosure, the organic light emitting unit comprises a substrate and an organic light emitting element disposed on the substrate, and an orthographic projection of the substrate on the sealing film is located within an orthographic projection region of the main body portion of the cover plate on the sealing film.

In some embodiments of the present disclosure, the organic light emitting unit comprises a substrate and an organic light emitting element disposed on the substrate, the substrate and the sidewall of the cover plate have a gap therebetween, and the display panel further comprises: a packaging adhesive filled in the gap such that the substrate is secured to the cover plate.

In some embodiments of the present disclosure, the display panel further comprises: a desiccant disposed inside the package space.

In another aspect of the present disclosure, there is provided a display device comprising the above display panel.

In some embodiments of the present disclosure, the cover plate of the display panel is configured to serve as a protective cover for protecting the display device.

In a further aspect of the present disclosure, there is provided a method of packaging a display panel, comprising: providing a cover plate, the cover plate comprising a main body portion and a sidewall disposed at a periphery of the main body portion and surrounding the main body portion; disposing an organic light emitting unit; and forming a sealing film disposed opposite the cover plate and sealingly engaged with the sidewall to define a sealed package space with the cover plate, so that the organic light emitting unit is sealed within the package space.

In some embodiments of the present disclosure, disposing the organic light emitting unit comprises: fixing the cover plate on a support structure; disposing the organic light emitting unit on the main body portion, the organic light emitting unit including a substrate and an organic light emitting element formed on the substrate; and filling and curing a packaging adhesive to secure the organic light emitting unit to the cover plate.

In some embodiments of the present disclosure, there is a gap between the substrate and the sidewall, and the packaging adhesive is filled in the gap.

In some embodiments of the present disclosure, forming the sealing film comprises: forming an organic layer, the organic layer sealingly engaged with the sidewall to form a sealed package space; and forming an inorganic layer on the organic layer.

In some embodiments of the present disclosure, the organic layer is formed by coating or evaporating an organic material.

In some embodiments of the present disclosure, the inorganic layer is formed by sputtering, plasma vapor deposition, or thermal evaporation.

In some embodiments of the present disclosure, the inorganic layer is made of a ceramic material.

In some embodiments of the present disclosure, the method further comprises: after the formation of the inorganic layer, repeating the steps of forming the organic layer and the inorganic layer to form a plurality of the organic layers and a plurality of the inorganic layers that are alternately stacked on each other.

In some embodiments of the present disclosure, the organic layer comprises a photo-curable polymer, and forming the organic layer comprises: irradiating the organic layer with an ultraviolet light to cure the photo-curable polymer.

BRIEF DESCRIPTION OF THE DRAWINGS

The above and/or additional aspects and advantages of the present disclosure will become apparent or easy to understand from the following detailed description taken in conjunction with the accompanying drawings, wherein.

DETAILED DESCRIPTIONS

Figure 1:
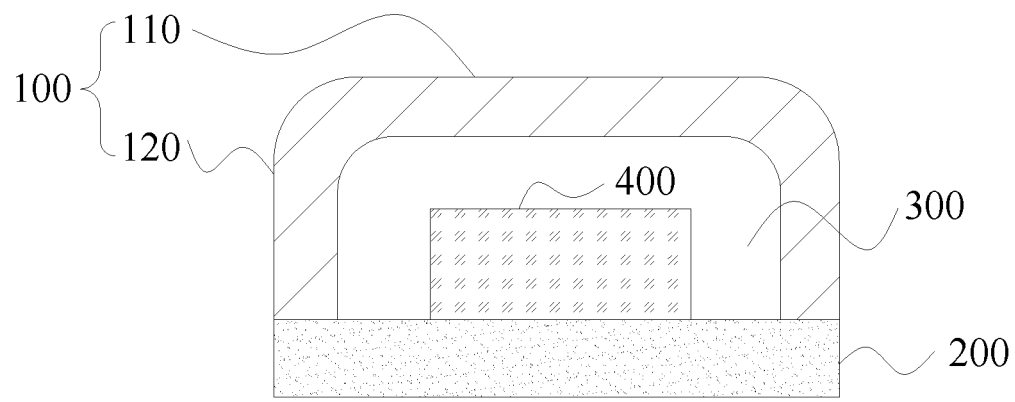
FIG. 1 schematically shows a structure of a display panel according to an embodiment of the present disclosure.

A detailed description of embodiments of the present disclosure will be given below. Illustrative embodiments are shown in the drawings, in which the similar reference signs are used throughout to represent the same or similar elements or elements having the same or similar functions. The embodiments described with reference to the drawings are illustrative, which are merely used to interpret the present disclosure, but cannot be understood as limitation to the present disclosure.

The present disclosure is based on the discovery and recognition of the following facts and problems by the inventors.

Currently, organic light emitting displays often have a problem of low luminous efficiency and short service life. As recognized by the inventors through in-depth research and a large number of experiments that this is mainly due to the less effective packaging technology and packaging structure used for organic light emitting displays. Those skilled in the art can understand that the outside moisture and oxygen may permeate into the organic light emitting element, which may affect the electrodes and organic functional layer of the organic light emitting display, thereby affecting the luminous efficiency and service life of the organic light emitting display. The packaging technology of the organic light emitting display directly affects the degree of permeation of outside moisture and oxygen. At present, cover plate packaging is mainly used as the packaging technology for packaging an organic light emitting display, that is, an epoxy resin is disposed between a cover plate and a substrate to prevent the permeation of moisture and oxygen from the outside. The inventors have found that the epoxy resin portion of the above packaging technology is one of the main ways for outside moisture and oxygen permeating into the organic light emitting display, resulting in low luminous efficiency and short service life of the organic light emitting display.

The present disclosure is intended to alleviate or solve at least one of the above mentioned problems at least to some extent.

In one aspect of the disclosure, the present disclosure provides a display panel. According to an embodiment of the present disclosure, referring to FIG. 1, the display panel includes a cover plate 100, a sealing film 200, and an organic light emitting unit 400. Wherein, the cover plate 100 has a main body portion 110 and a sidewall 120 disposed at a periphery of the main body portion 110. The sealing film 200 and the cover plate 100 define a package space 300, and the organic light emitting unit 400 is sealed within the package space 300. Specifically, a sidewall 120 is disposed at the periphery of the main body portion 110, extends toward the sides of the package space 300, and surrounds the main body portion 110. A box-shaped space for accommodating the organic light emitting element 400 is defined by the inner side of the main body portion 110 and the sidewall 120. The sealing film 200 is disposed on a side of the sidewall 120 that is not connected to the main body portion 110 and sealingly engages with the sidewall 120 of the cover plate 100. Thereby, the permeability of outside moisture and oxygen can be reduced, thereby protecting the organic light emitting element, and improving the luminous efficiency and service life of the organic light emitting display formed by the display panel.

The respective structures of the display panel will be described in detail below according to specific embodiments of the present disclosure.

Figure 2:
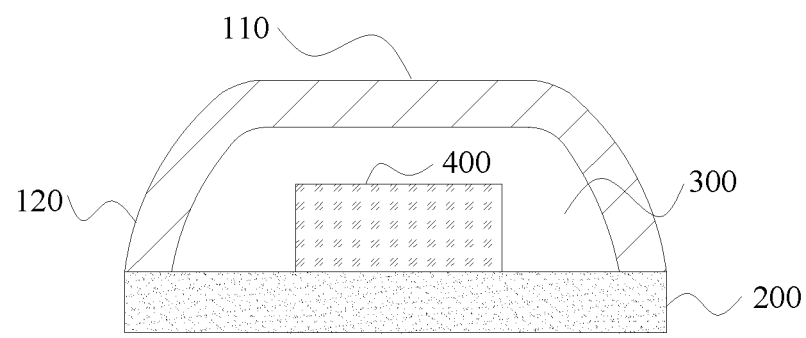
FIG. 2 schematically shows a structure of a display panel according to another embodiment of the present disclosure.
Figure 3:
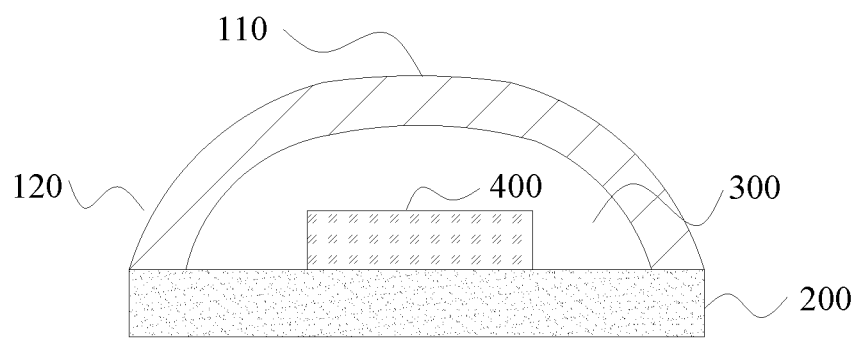
FIG. 3 schematically shows a structure of a display panel according to still another embodiment of the present disclosure.

The specific shape of the cover plate is not particularly limited as long as it can form a package space with the sealing film, and may be designed by those skilled in the art according to specific conditions. For example, referring to FIG. 1, at least a portion of the sidewall 120 may be a curved structure, such as a portion of the sidewall 120 that is coupled to the main body portion 110 may be a curved structure, and the remaining portion of the sidewall 120 is a linear structure in the vertical direction. Alternatively, referring to FIG. 2, the sidewall 120 may be entirely curved. Further, a surface of the main body portion 110 on a side away from the package space 300 may be a flat surface (as shown in FIGS. 1 and 2), and may also be a curved surface (refer to FIG. 3). That is to say, the cover plate according to the embodiment of the present disclosure can be easily constructed by using 2.5D glass or 3D glass to prevent the permeation of outside moisture and oxygen, and reduce the permeability of moisture and oxygen. Since 2.5D glass and 3D glass have a downwardly curved edge (i.e., the sidewall 120), there is a space inside the 2.5D glass or 3D glass, which can be used to accommodate the organic light emitting element 400. That is to say, in the display panel according to the embodiment of the present disclosure, the outer packing structure of the organic light emitting unit is realized by the side of the 2.5D glass or 3D glass (i.e., the sidewall 120). Compared with a conventional display panel that realizes packaging with a flat glass, the side packaging of the display panel according to an embodiment of the present disclosure is realized by glass, and thus has better packaging reliability than an package realized by resin.

Figure 4:
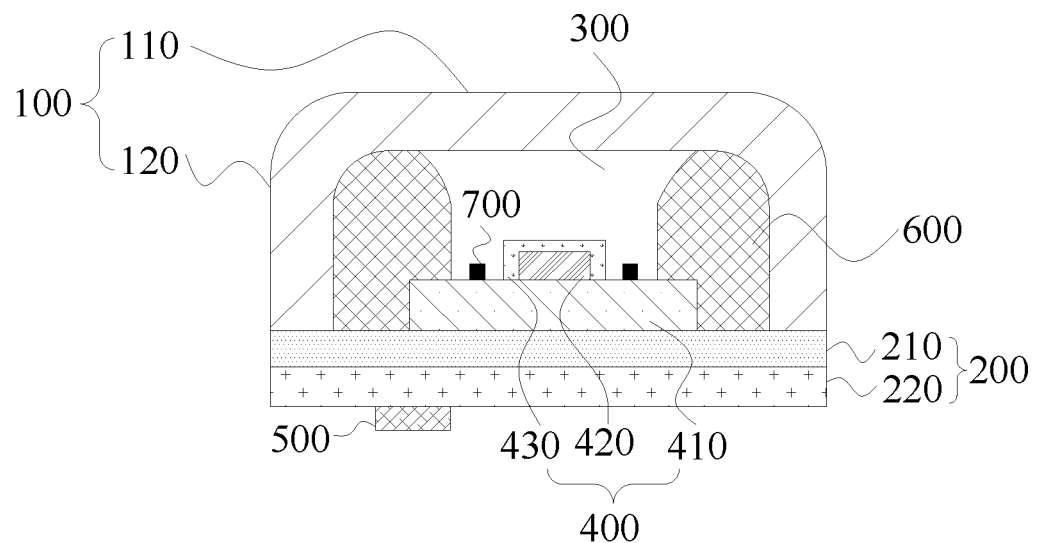
FIG. 4 schematically shows a structure of a display panel according to a further embodiment of the present disclosure.

According to an embodiment of the present disclosure, referring to FIG. 4, the sealing film 200 may include: an organic layer 210 and an inorganic layer 220. The organic layer 210 is disposed adjacent to the organic light emitting element 400, and the inorganic layer 220 is disposed on a side of the organic layer 210 away from the organic light emitting element 400. Thereby, a package space may be formed using the sealing film and the cover plate to prevent the permeation of outside moisture and oxygen and to reduce the moisture and oxygen permeability.

The number of layers of the sealing film is not particularly limited as long as the sealing of the organic light emitting element can be achieved, which can be designed by those skilled in the art according to specific conditions. For example, according to an embodiment of the present disclosure, the sealing film 200 may have a single layer structure, that is, the sealing film 200 may be composed of a single organic layer 210. According to some further embodiments of the present disclosure, the sealing film 200 may also include a plurality of organic layers 210 and inorganic layers 220 that are sequentially stacked on each other. That is, an organic layer 210 is disposed on a side mostly adjacent to the organic light emitting unit 400, and the sealing film 200 is formed by alternately stacking inorganic layers 220 and organic layers 210. Thereby, the moisture and oxygen permeability can be greatly reduced.

According to an embodiment of the present disclosure, the organic layer 210 may be made of a polymer material such as polyacrylate or polyimide. Thereby, holes at the joints can be filled in, so that the overall structure is completely sealed and smoothed. According to an embodiment of the present disclosure, the inorganic layer 220 may be made of a ceramic film. Thereby, the moisture and oxygen permeability can be further reduced.

In some embodiments according to the present disclosure, a connection terminal 500 is reserved on a side of the sealing film 200 away from the package space 300. The connection terminal 500 is electrically connected to the organic light emitting unit 400. The connection terminal 500 can be used to connect an external circuit structure such as a control IC or a mobile terminal motherboard, to realize the function of the organic light emitting element. Those skilled in the art can understand that the organic light emitting unit 400 may include, for example, a substrate 410 and an organic light emitting element disposed thereon. The organic light emitting element may include an organic light emitting film layer 420 and a protective layer 430 etc., thereby realizing a light emitting function of the organic light emitting device. It can be understood by those skilled in the art that the organic light emitting unit 400 is disposed in the package space in such a manner that the organic light emitting element is disposed on a side close to the main body portion, so that the light emitted by the organic light emitting unit 400 can be emitted through the cover plate 100. According to the embodiment of the present disclosure, the specific manner in which the organic light emitting unit 400 is secured in the package space is not particularly limited, and can be selected by those skilled in the art according to actual conditions. For example, according to a specific embodiment of the present disclosure, the organic light emitting unit 400 may be secured on a surface of the sidewall 120 toward the package space by using a packaging adhesive. Those skilled in the art can understand that an orthographic projection of the substrate 410 on the sealing film 200 should be located within the orthographic projection region of the main body portion 110 of the cover plate on the sealing film 200. There is a gap between the substrate 410 and the inner surface of the sidewall 120. The organic light emitting unit 400 can be secured by filling a packaging adhesive 600 at the gap. The amount of the packaging adhesive is not particularly limited as long as the packaging adhesive can completely fill the gap between the substrate and the cover plate, and the packaging adhesive can adhere to the surface of the substrate to ensure the bonding performance between the substrate and the cover plate, which can be designed by those skilled in the art according to actual needs. According to an embodiment of the present disclosure, the display panel may further include a desiccant 700 disposed within the package space 300. The desiccant 700 can absorb the moisture and oxygen content in the sealed package space 300, thereby increasing the service life of the display panel.

Figure 5:
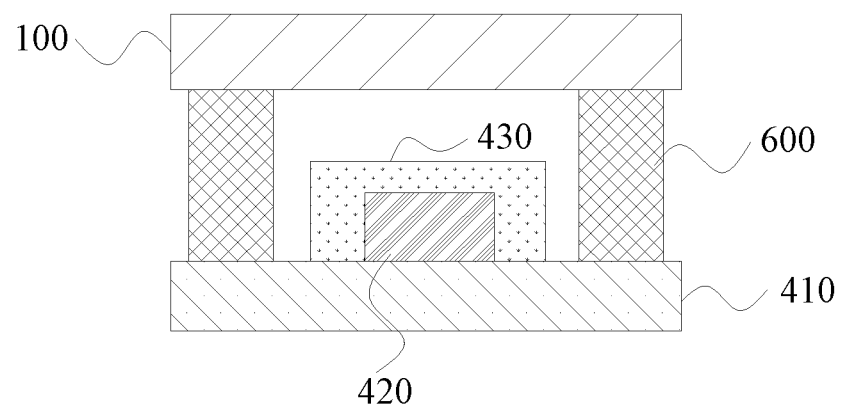
FIG. 5 schematically shows a structure of a display panel in prior art.

As described above, in the prior art, the display panel is packaged by a cover plate packaging technique, and an epoxy resin is disposed between the cover plate and the substrate to prevent the permeation of moisture and oxygen from the outside. Specifically, referring to FIG. 5, a cover plate 100, a substrate 410, and a packaging adhesive 600 constitute a package space, wherein the packaging adhesive 600 is made of an epoxy resin. The packaging adhesive 600 is one of the main ways for outside moisture and oxygen to permeate into the package space. The moisture and oxygen permeating into the organic light emitting film layer 420 may affect the luminescence property and the service life of the organic light emitting film layer 420, thereby affecting the luminous efficiency and service life of the organic light emitting device.

According to an embodiment of the present disclosure, the display panel is packaged with a 2.5D or 3D cover plate 100 such that the cover plate 100 prevents the permeation of moisture and oxygen at the side edges of the display panel. The cover plate 100 according to the embodiment of the present application has a better effect of preventing the permeation of outside moisture and oxygen than the packaging adhesive 600 in the prior art, and can reduce the moisture and oxygen permeability. According to an embodiment of the present disclosure, the display panel further includes a sealing film 200 that can prevent the permeation of moisture and oxygen from the back of the display panel to achieve a high performance of preventing the permeation of moisture and oxygen. Moreover, according to an embodiment of the present disclosure, the sealing film 200 and the cover plate 100 constitute a sealed package space to further reduce the moisture and oxygen permeability, and increase the service life of the display panel.

In another aspect of the disclosure, the present disclosure provides a display device. According to an embodiment of the present disclosure, the display device includes the display panel described above, thereby the display device has all the features and advantages of the display panel described above, which will not be repeated in detail herein. In general, the display device may have a higher luminous efficiency and a longer service life.

Figure 6:
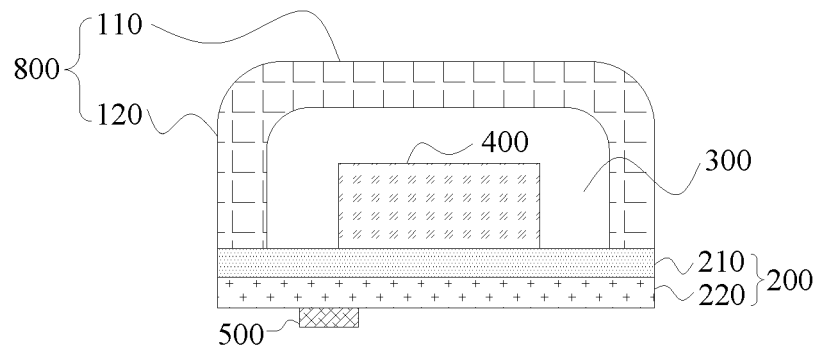
FIG. 6 schematically shows a structure of a display device according to an embodiment of the present disclosure.

According to an embodiment of the present disclosure, referring to FIG. 6, the display device includes a protective cover 800, a sealing film 200, and an organic light emitting element 400. The protective cover 800 may be formed by the cover plate describe above. That is, the cover plate of the display panel described above can also be used as a protective cover of the display device. That is, the protective cover 800 may also have a main body portion 110 and a sidewall 120 disposed at a periphery of the main body portion 110. The sealing film 200 and the protective cover 800 define a package space 300, and the organic light emitting unit 400 is sealed within the package space 300. Thereby, the display device may have a higher luminous efficiency and a longer service life.

According to an embodiment of the present disclosure, the protective cover 800 may be the cover plate described above, thereby the protective cover has all the features and advantages of the cover plate described above, which will not be described in detail herein. For example, according to an embodiment of the present disclosure, a surface of the sidewall 120 on a side away from the package space is a curved surface, and a surface of the main body portion 110 on a side away from the package space 300 may be a flat surface or a curved surface.

According to an embodiment of the present disclosure, the protective cover 800 having the above structure is directly employed in the display device to omit the protective cover plate in the package structure. That is to say, the protective cover 800 can have both a protection function and a packaging function. Thereby, the structure of the display device can be simplified, the cost can be reduced, and the overall thickness of the display device can be further reduced.

Figure 7:
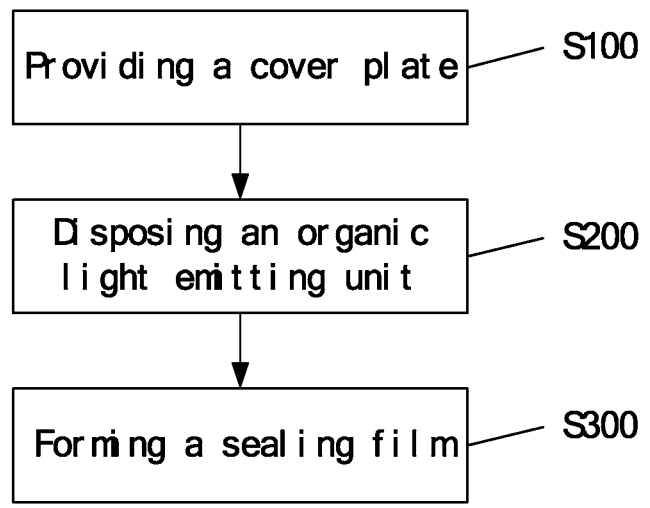
FIG. 7 schematically shows a flow chart for a method of packaging a display panel according to an embodiment of the present disclosure.

In another aspect of the present disclosure, the present disclosure provides a method of packaging a display panel. According to an embodiment of the present disclosure, the display panel may be the display panel described above, and thus the display panel may have the same features and advantages as the display panel described above, which will not be described in detail. According to an embodiment of the present disclosure, referring to FIG. 7, the method includes:

S100: Providing a Cover Plate according to an embodiment of the present disclosure, a cover plate is provided in this step. The structure of the cover plate has been described above in detail, which will not be repeated herein. For example, according to an embodiment of the present disclosure, the cover plate has a main body portion and a sidewall disposed at a periphery of the main body portion. The cover plate may be formed of glass. A curved structure described above can be formed by means of, including but not limited to, injection molding, CNC cutting, or the like, so as to constitute a 2.5D or 3D cover plate.

S200: Disposing an Organic Light Emitting Unit according to an embodiment of the present disclosure, an organic light emitting unit is disposed inside the cover plate. As described above, the organic light emitting unit 400 may include, for example, a substrate 410 and an organic light emitting element disposed thereon. The organic light emitting element may include an organic light emitting film layer 420 and a protective layer 430 etc. In the package space, the organic light emitting unit 400 may be disposed to have the organic light emitting element close to the main body portion, so that the light emitted by the organic light emitting unit 400 can be emitted through the cover plate 100. According to the embodiment of the present disclosure, the specific manner in which the organic light emitting unit 400 is secured in the package space is not particularly limited, and can be selected by those skilled in the art according to actual conditions. For example, according to a specific embodiment of the present disclosure, the organic light emitting unit 400 may be secured on a surface of the sidewall 120 facing the package space by using a packaging adhesive.

Specifically, in this step, an organic light-emitting film layer, a protective layer, and a desiccant may be first formed on a large substrate, which is cut into individual organic light emitting units in a dry inert gas environment. Then, the organic light emitting units are secured in the space defined by the main body portion and the sidewall. Specifically, the following step may be adopted to secure the organic light emitting units.

Figure 8:
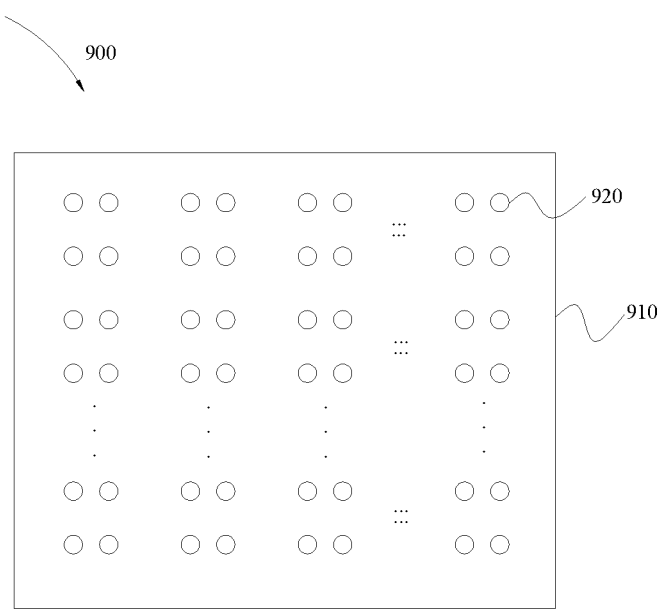
FIG. 8 schematically shows a structure of a support structure according to an embodiment of the present disclosure.

Firstly, the cover plate may be secured on a support structure. According to an embodiment of the present disclosure, referring to FIG. 8, the support structure 900 may include: a support structure substrate 910 and suckers 920 disposed on the support structure substrate 910. The suckers 920 may be slidably locked on the support structure substrate 910, that is, the positions of the suckers 920 can be adjusted according to products of different sizes to suck the produces. Thus, they can be used to package products of different sizes.

Figure 9:
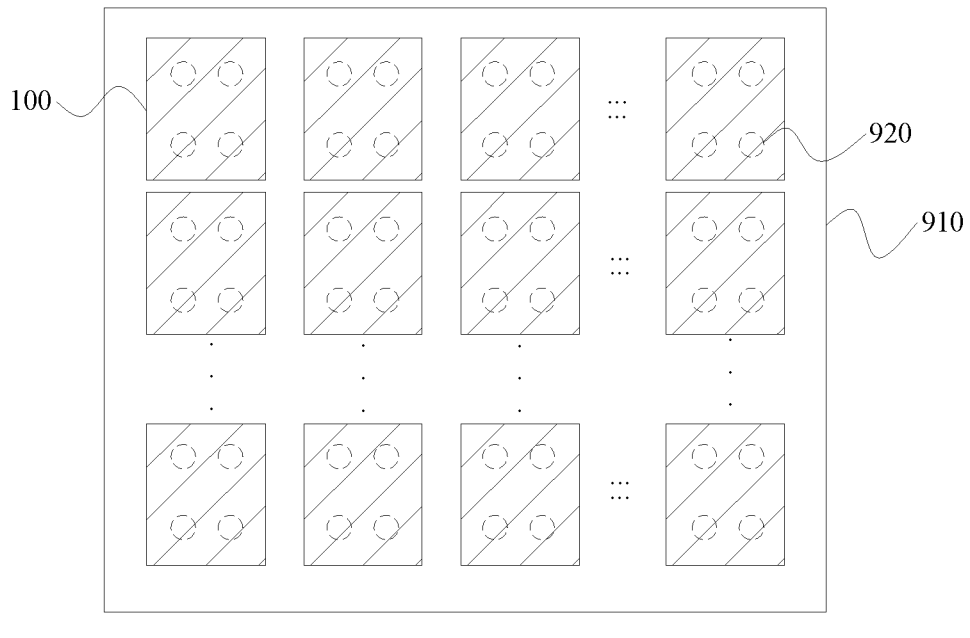
FIG. 9 schematically shows a part of a flow chart for a method of packaging a display panel according to an embodiment of the present disclosure.
Figure 9:
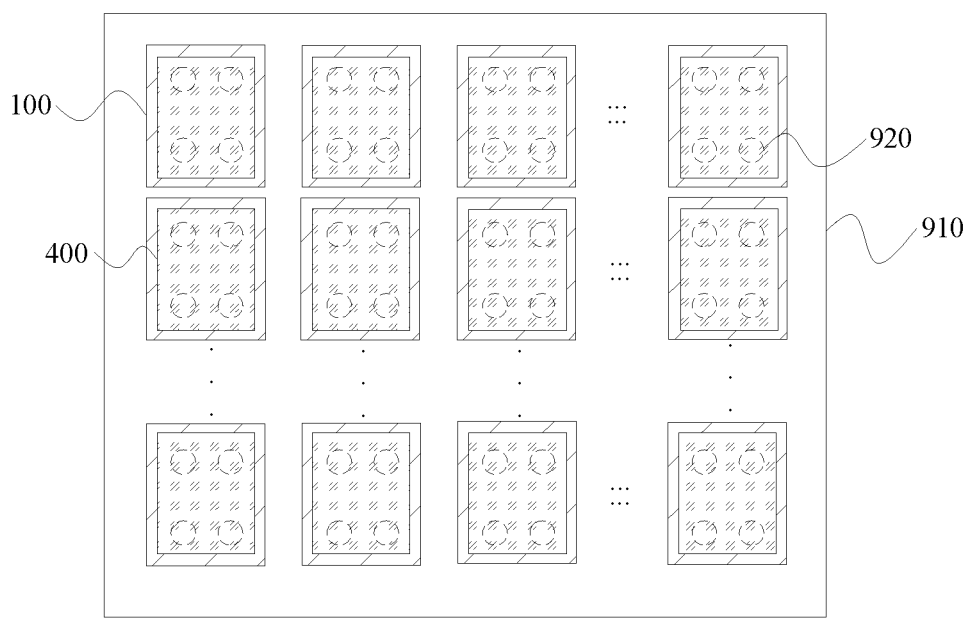

According to an embodiment of the present disclosure, the support structure is laid low and the cover plate is secured to the support structure. Specifically, according to the size of the display panel, the positions of the suckers are adjusted, and then the cover plate is sucked by the suckers. According to an embodiment of the present disclosure, referring to FIG. 9 (*a*), a plurality of cover plates 100 may be simultaneously secured on the support structure substrate 910. Thereby, a plurality of display panels can be packaged at the same time.

Figure 10:
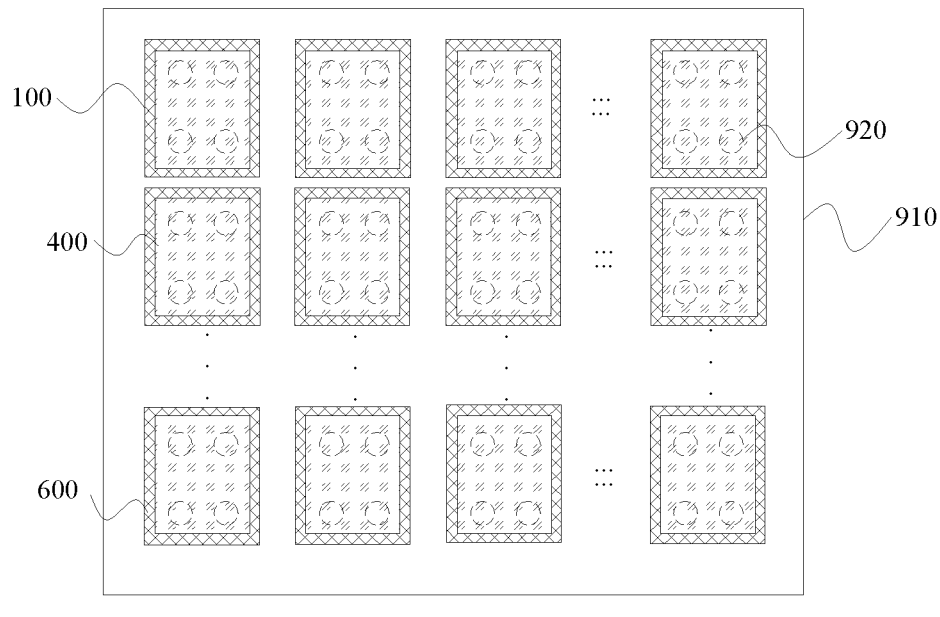
FIG. 10 schematically shows a part of a flow chart for a method of packaging a display panel according to an embodiment of the present disclosure.
Figure 10:
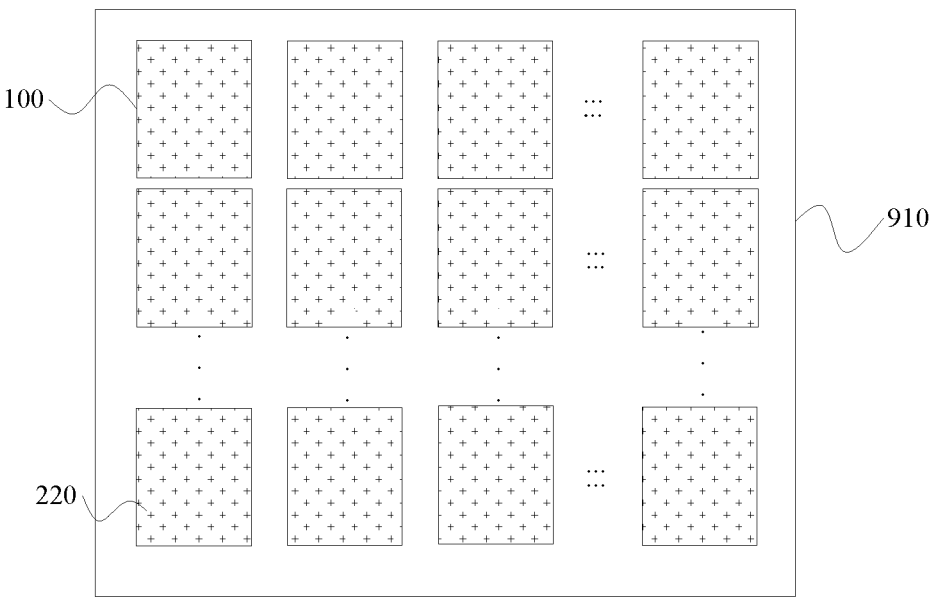

Next, the organic light emitting units are placed inside the cover plate. According to an embodiment of the present disclosure, referring to FIG. 9 (*b*), the plurality of organic light emitting units 400 described above are respectively placed inside a plurality of cover plates 100. As described above, there may be a gap between the sidewall of the cover plate and the organic light emitting units 400, and a packaging adhesive is applied at the gap to secure the organic light emitting units 400. According to an embodiment of the present disclosure, referring to FIG. 10 (*c*), a packaging adhesive 600 is provided between the sidewall of the cover plate 100 and the organic light emitting units 400. Thereby, the organic light emitting units can be secured inside the cover plate. According to an embodiment of the present disclosure, after the packaging adhesive 600 is coated, it needs to be cured to increase the stability of securing the organic light emitting element. According to an embodiment of the present disclosure, the packaging adhesive 600 may be cured by ultraviolet light (UV curable). The amount of the packaging adhesive is not particularly limited as long as the packaging adhesive can completely fill the gap between the substrate and the cover plate, and the packaging adhesive can adhere to the surface of the substrate to ensure the bonding performance between the substrate and the cover plate, which can be designed by those skilled in the art according to actual needs.

S300: Forming a Sealing Film according to an embodiment of the present disclosure, in this step, a sealing film is formed. The arrangement position of the sealing film has been described in detail previously, which will not be repeated herein.

Specifically, according to an embodiment of the present disclosure, after the foregoing steps have been completed, a sealing film may be disposed on a side of the organic light emitting unit away from the cover plate, and a sealed package space is formed between the sealing film and the cover plate. The sealing film includes an organic layer and an inorganic layer. The constituent materials of the organic layer and the inorganic layer have been described in detail above and will not be repeated herein. For example, according to an embodiment of the present disclosure, the organic layer may be made of a polymer material such as polyacrylate or polyimide. Thereby, holes at the joints can be filled in, so that the overall structure is completely sealed and smoothed. According to an embodiment of the present disclosure, the inorganic layer may be made of a ceramic film. Thereby, the permeability of moisture and oxygen can be further reduced.

The way in which the organic layer and the inorganic layer are formed is also not particularly limited, and may be designed by those skilled in the art according to specific conditions. For example, according to an embodiment of the present disclosure, the organic layer may be formed by coating or rapid evaporation, etc., and finally polymerized and cured using ultraviolet light. The inorganic layer may be formed by sputtering, plasma vapor deposition, or thermal evaporation, etc., and the inorganic layer may be made of a ceramic material. Thereby, the organic layer and the inorganic layer can be obtained by the above simple processes. According to an embodiment of the present disclosure, an organic layer may be disposed on a side adjacent to the organic light emitting element, and then an inorganic layer is disposed on a side of the organic layer away from the organic light emitting element, and finally resulting in the structure shown in FIG. 10 (d). According to an embodiment of the present disclosure, the sealing film may be a multi-layered structure in which organic layers and inorganic layers are alternately stacked on each other. The number of layers of the organic layers and the inorganic layers is not particularly limited, and may be specified by those skilled in the art according to specific conditions.

In the description of the present disclosure, it is to be understood that the azimuth or positional relationship indicated by the terms "upper", "lower" and the like is based on the azimuth or positional relationship shown in the drawings and is merely for the purpose of facilitating the description of the disclosure and simplified description, rather than indicating or implying that the device or element referred to must have a specific orientation, constructed and operated in a particular orientation and therefore cannot be construed as limiting the present disclosure.

In the description of this specification, reference throughout this specification to "an embodiment", "another embodiment", etc. means that a particular feature, structure, material or characteristic described in connection with the embodiment is included in at least one embodiment of the present disclosure. Therefore, illustrative references to the above terms in various portions of this specification are not necessarily all referring to the same embodiment or example. Furthermore, the particular features, structures, materials or characteristics may be combined as suitable in one or more embodiments of the present disclosure. In addition, those skilled in the art may combine the different embodiments or examples described in this specification and features of different embodiments or examples without conflicting with each other.

Although embodiments of the present disclosure have been illustrated and described above, it will be understood that the above-described embodiments are exemplary and not to be construed as limiting the present disclosure. Those of ordinary skill in the art may make variations, modifications, substitutions, and changes to the above described embodiments within the scope of the present disclosure.

What is claimed is:

1. A method of packaging a display panel, comprising:
   providing a cover plate, the cover plate comprising a main body portion and a sidewall disposed at a periphery of the main body portion and surrounding the main body portion;
   disposing an organic light emitting unit; and
   forming a sealing film disposed opposite the cover plate and sealingly engaged with the sidewall to define a sealed package space with the cover plate, so that the organic light emitting unit is sealed within the package space,
   wherein disposing the organic light emitting unit comprises:
   fixing the cover plate on a support structure;
   disposing the organic light emitting unit on the main body portion, the organic light emitting unit including a substrate and an organic light emitting element formed on the substrate; and
   filling and curing a packaging adhesive to secure the organic light emitting unit to the cover plate.

2. The method according to claim 1, wherein there is a gap between the substrate and the sidewall, and the packaging adhesive is filled in the gap.

3. The method according to claim 1, wherein forming the sealing film comprises:
   forming an organic layer, the organic layer sealingly engaged with the sidewall to form a sealed package space; and
   forming an inorganic layer on the organic layer.

4. The method according to claim 3, wherein the organic layer is formed by coating or evaporating an organic material.

5. The method according to claim 3, wherein the inorganic layer is formed by sputtering, plasma vapor deposition, or thermal evaporation.

6. The method according to claim 3, wherein the inorganic layer is made of a ceramic material.

7. The method according to claim 3, further comprising:
   after the formation of the inorganic layer, repeating the steps of forming the organic layer and the inorganic layer to form a plurality of the organic layers and a plurality of the inorganic layers that are alternately stacked on each other.

8. The method according to claim 3, wherein the organic layer comprises a photo-curable polymer, and forming the organic layer comprises:
   irradiating the organic layer with an ultraviolet light to cure the photo-curable polymer.

* * * * *